United States Patent
Klinge et al.

(10) Patent No.: US 11,650,638 B2
(45) Date of Patent: *May 16, 2023

(54) DUAL REDUNDANT COOLING SYSTEM FOR A CONTAINER

(71) Applicant: Klinge Corporation, York, PA (US)

(72) Inventors: Allan Klinge, Lititz, PA (US); Henrik Klinge, York, PA (US)

(73) Assignee: Klinge Corporation, York, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/464,112

(22) Filed: Sep. 1, 2021

(65) Prior Publication Data

US 2021/0397229 A1    Dec. 23, 2021

Related U.S. Application Data

(63) Continuation of application No. 16/441,402, filed on Jun. 14, 2019, now Pat. No. 11,137,805.

(51) Int. Cl.
   *G06F 1/20*   (2006.01)
   *H05K 7/20*   (2006.01)

(52) U.S. Cl.
   CPC .............. *G06F 1/20* (2013.01); *H05K 7/2019* (2013.01); *H05K 7/20727* (2013.01)

(58) Field of Classification Search
   CPC ...... F25B 9/002; F25B 49/022; F25B 49/005; F25D 11/003; F25D 19/04; F25D 29/006; F25D 29/008; G06F 1/20
   See application file for complete search history.

(56) References Cited

U.S. PATENT DOCUMENTS

| | | |
|---|---|---|
| 4,332,137 A | 6/1982 | Hayes, Jr. |
| 4,771,823 A | 9/1988 | Chan |

(Continued)

FOREIGN PATENT DOCUMENTS

| | | |
|---|---|---|
| CN | 107356035 A | 11/2017 |
| DE | 10 2014 016 939 A1 | 5/2016 |
| WO | 2015090191 A1 | 6/2015 |

OTHER PUBLICATIONS

Co-Pending international application PCT/US2020/037196 Search Report dated Sep. 16, 2020, 7 pages.

(Continued)

*Primary Examiner* — Kun Kai Ma
(74) *Attorney, Agent, or Firm* — Barley Snyder

(57) ABSTRACT

A dual redundant cooling system for a container is provided. The dual redundant cooling system includes a first cooling unit and a second cooling unit. The first cooling unit is positioned in a first cabinet attached to the container. The first cooling unit includes a first controller operating a first cooling loop to cool an interior of the container. The second cooling unit is positioned in a second cabinet attached to the container and adjacent the first cabinet. The second cooling unit includes a second controller operating a second cooling loop to cool the interior of the container. The first cooling unit and the first cooling loop are separate from the second cooling unit and the second cooling loop. The first controller and the second controller communicate a switch signal between each other so that either the first cooling unit is a primary cooling unit operating the first cooling loop or the second cooling unit is the primary cooling unit operating the second cooling loop. The switch signal switching the primary cooling unit.

16 Claims, 10 Drawing Sheets

(56) References Cited

U.S. PATENT DOCUMENTS

| | | | |
|---|---|---|---|
| 5,129,235 | A | 7/1992 | Renken et al. |
| 5,388,420 | A | 2/1995 | Yoshida et al. |
| 8,555,663 | B2 | 10/2013 | Shinya et al. |
| 9,295,182 | B2 | 3/2016 | Iyengar et al. |
| 2004/0060312 | A1 | 4/2004 | Horn et al. |
| 2005/0225270 | A1 | 10/2005 | Schnetzka et al. |
| 2007/0074528 | A1 | 4/2007 | Rodriguez et al. |
| 2008/0307813 | A1 | 12/2008 | Lifson et al. |
| 2014/0150482 | A1 | 6/2014 | Ueno et al. |
| 2015/0158667 | A1 | 6/2015 | Farrar |
| 2015/0166262 | A1 | 6/2015 | Farrar |
| 2017/0176083 | A1 | 6/2017 | Sul et al. |
| 2017/0182869 | A1 | 6/2017 | Kujak et al. |
| 2017/0321961 | A1 | 11/2017 | Tobin |
| 2018/0031291 | A1* | 2/2018 | Kondrk ................ F25B 49/022 |
| 2018/0195773 | A1 | 7/2018 | Saunders et al. |
| 2018/0213684 | A1* | 7/2018 | Bailey ................ F25B 49/022 |
| 2018/0281564 | A1 | 10/2018 | Baek et al. |
| 2018/0347896 | A1 | 12/2018 | Eddy et al. |
| 2019/0364140 | A1 | 11/2019 | Li |
| 2020/0166237 | A1 | 5/2020 | Speaker et al. |
| 2020/0340723 | A1* | 10/2020 | Satou ................ F25D 21/006 |

OTHER PUBLICATIONS

Co-Pending international application PCT/US2020/037196 written opinion dated Sep. 16, 2020, 9 pages.
European Patent Office Communications, Application No. 20751721.0-1009, dated Jan. 25, 2022, 11 pages.
Internationational PCT Report, Applciation No. US2020/037196, dated Dec. 23, 2021, 10 pages.

* cited by examiner

US 11,650,638 B2

DUAL REDUNDANT COOLING SYSTEM FOR A CONTAINER

CROSS-REFERENCE TO RELATED APPLICATIONS

This application is a continuation of U.S. non-provisional patent application Ser. No. 16/441,402, filed on Jun. 14, 2019, the contents of which are incorporated herein by reference

FIELD OF THE INVENTION

The present invention relates to a cooling system and, more particularly, to a dual redundant cooling system for a container.

BACKGROUND

Certain goods, such as pharmaceuticals, require a temperature-controlled supply chain, also referred to as a cold chain. During storage and shipping, for example, cold chain goods must be held within a desired low-temperature range. This is particularly critical for pharmaceutical or biopharmaceutical products, as even a small temperature variation can lead to expensive and time-consuming evaluations of product liability and even complete product loss. Numerous pharmaceuticals do not arrive at their destination in usable condition. Even small temperature variations in the cold chain can cost hundreds of thousands of dollars in testing and wasted supplies.

SUMMARY

A dual redundant cooling system for a container is provided. The dual redundant cooling system includes a first cooling unit and a second cooling unit. The first cooling unit is positioned in a first cabinet attached to the container. The first cooling unit includes a first controller operating a first cooling loop to cool an interior of the container. The second cooling unit is positioned in a second cabinet attached to the container and adjacent the first cabinet. The second cooling unit includes a second controller operating a second cooling loop to cool the interior of the container. The first cooling unit and the first cooling loop are separate from the second cooling unit and the second cooling loop. The first controller and the second controller communicate a switch signal between each other so that either the first cooling unit is a primary cooling unit operating the first cooling loop or the second cooling unit is the primary cooling unit operating the second cooling loop. The switch signal switching the primary cooling unit.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
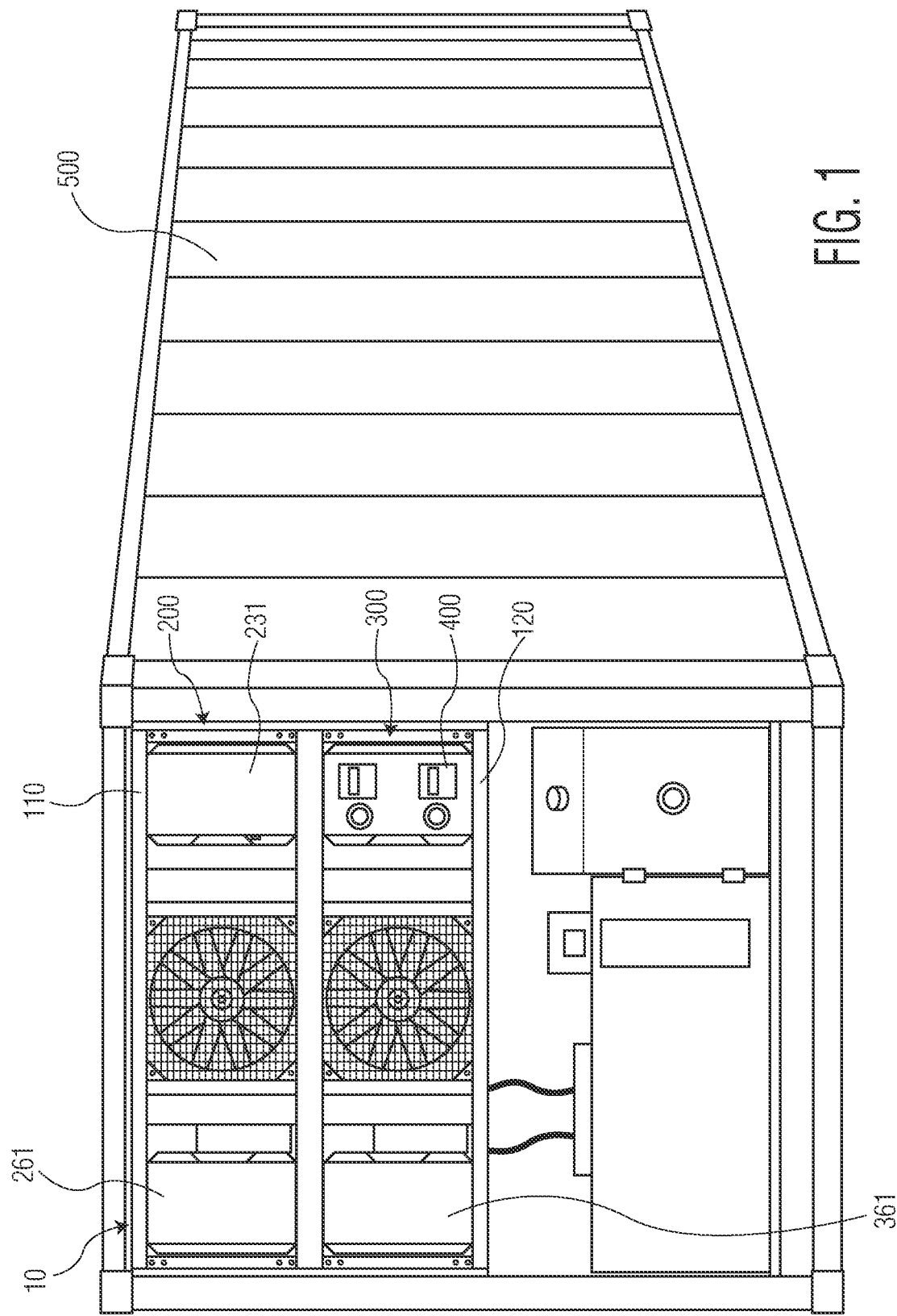
FIG. 1 is a perspective view of a dual redundant cooling system according to an embodiment on a container.

Embodiments of the present invention will be described hereinafter in detail with reference to the attached drawings, wherein like reference numerals refer to like elements. The present invention may, however, be embodied in many different forms and should not be construed as being limited to the embodiments set forth herein; rather, these embodiments are provided so that the disclosure will convey the concept of the invention to those skilled in the art.

Figure 2:
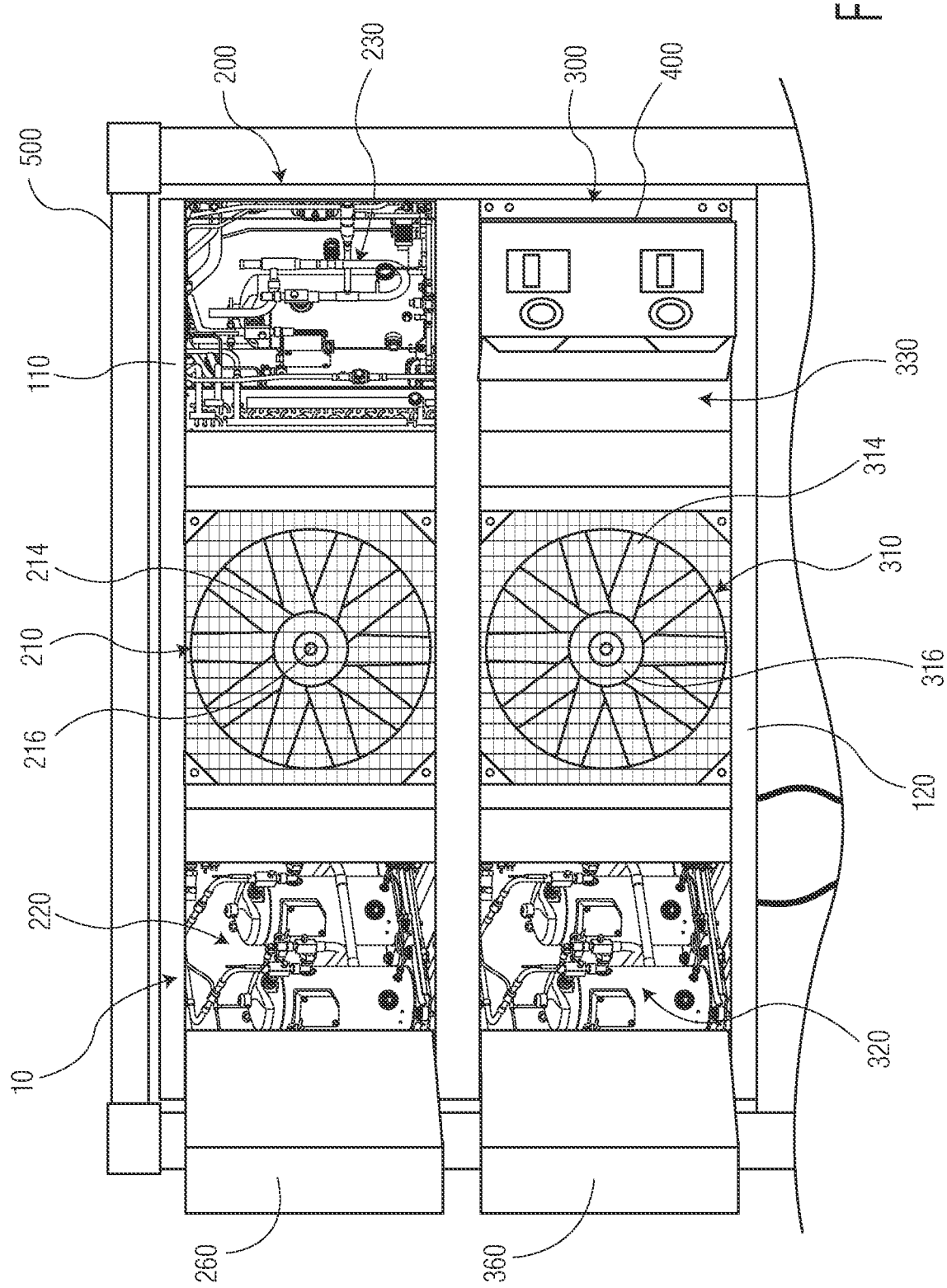
FIG. 2 is an end view of the cooling system on the container.

A dual redundant cooling system 10 according to an embodiment is shown in FIGS. 1 and 2. The dual redundant cooling system 10 may also be referred to as a cooling system 10 throughout the specification. The cooling system 10 generally includes a first cabinet 110, a second cabinet 120, a first cooling unit 200 positioned in the first cabinet 110, a second cooling unit 300 positioned in the second cabinet 120, and a system interface box 400 connected to the cooling units 200, 300.

As shown in FIGS. 1 and 2, the cooling system 10 is positioned on an end of a container 500. The cooling system 10 is used control a temperature of an interior of the container 500, as described in greater detail below. In an embodiment, the container 500 is an insulated shipping container. In other embodiments, the container 500 may not be insulated, and may be any type of container used for storing or shipping goods.

As shown in FIGS. 1 and 2, the first cabinet 110 and the second cabinet 120 are positioned on top of one another on the end of the container 500. The first cabinet 110 and second cabinet 120 are secured in place on the end of the container 500 and respectively house the elements of the first cooling unit 200 and the second cooling unit 300.

The first cooling unit 200 and the second cooling unit 300 are separate but each have identical components that function identically. As will become clear in the following description, identical components of the first cooling unit 200 and the second cooling unit 300 have similar reference numbers; reference numbers of identical components between the first cooling unit 200 and the second cooling unit 300 share the same last two digits. These identical components will be described and referenced together in some of the drawings and a portion of the description, in which multiple similar reference numbers reference the same component to indicate that the same component is present in the first cooling unit 200 and the second cooling unit 300. Where the identical components of the first cooling unit 200 and the second cooling unit 300 are referenced separately, the component of the first cooling unit 200 may be labeled "first" and the component of the second cooling unit 300 may be labeled "second."

Each of the first cooling unit 200 and the second cooling unit 300, as shown in FIGS. 1, 2, 5, and 6, has a condenser 210, 310, a high compressor 220, 320 and a low compressor 230, 330, an evaporator 240, 340 connected to the condenser 210, 310, and a unit control box 260, 360 connected to and controlling the condenser 210, 310, the high compressor 220, 320, the low compressor 230, 330, and the evaporator 240, 340.

Figure 3:
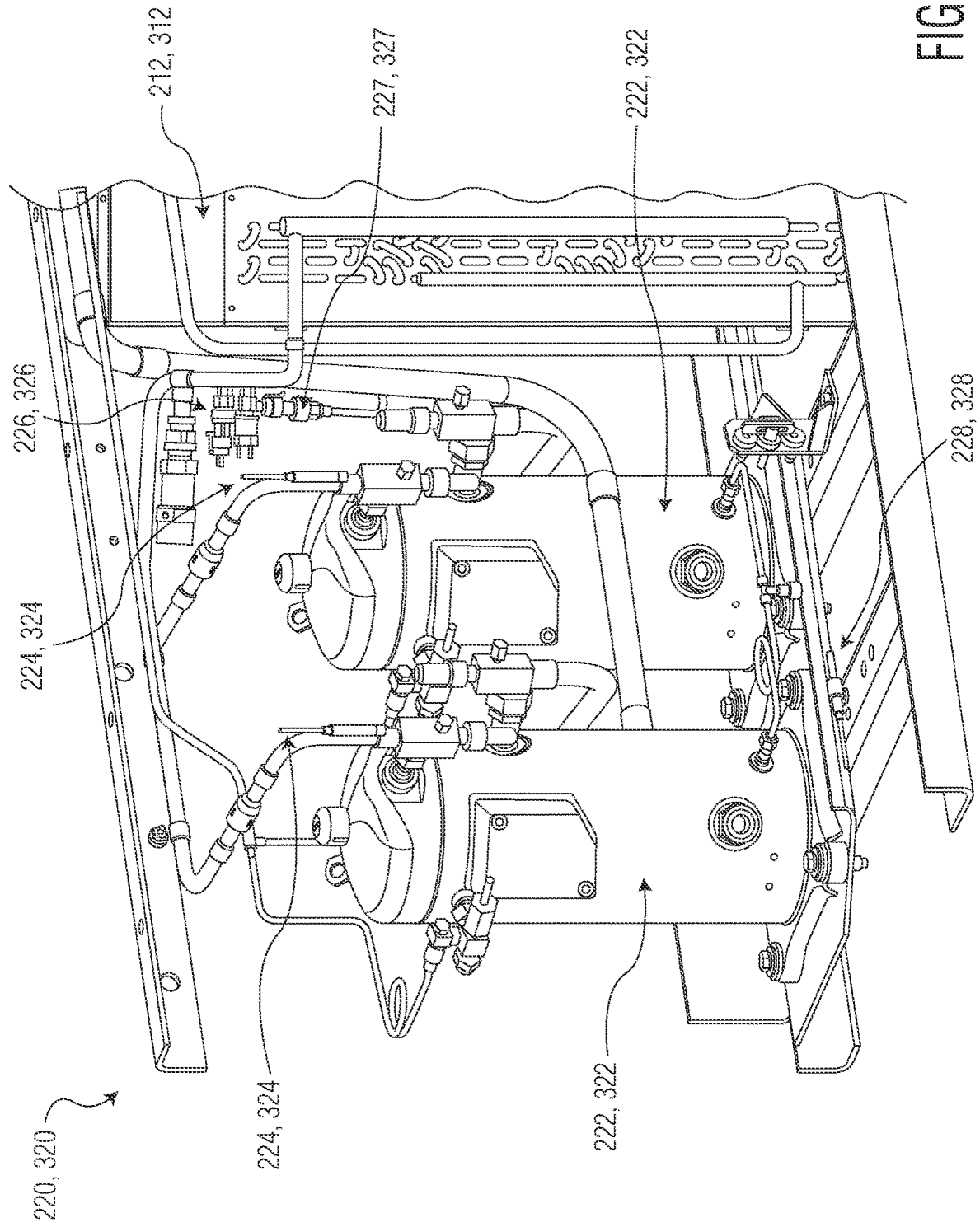
FIG. 3 is a perspective view of a first compressor of a cooling unit of the cooling system.
Figure 4:
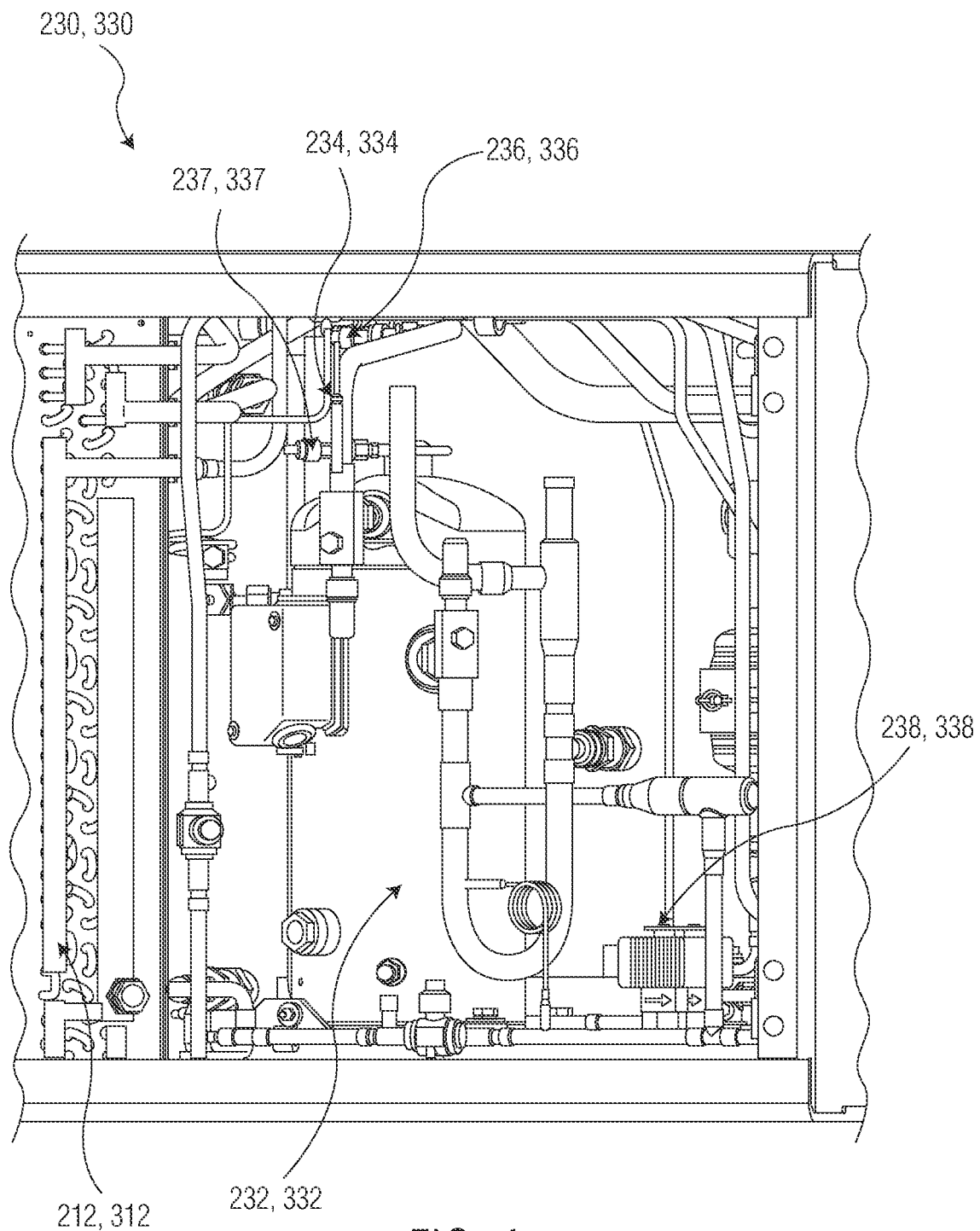
FIG. 4 is a perspective view of a second compressor of the cooling unit.

Each condenser 210, 310, as shown in FIGS. 2-4, has a condenser coil 212, 312, a condenser fan 214, 314 adapted to blow air over the condenser coil 212, 312, and a condenser motor 216, 316 adapted to drive the condenser fan 214, 314. The condenser coil 212, 312 is connected to and receives a refrigerant from the high compressor 220, 320 and the low compressor 230, 330. The refrigerant received at the condenser coil 212, 312 is in a vapor state with a high temperature and a high pressure. The condenser fan 214, 314 blows air over the condenser coil 212, 312, cooling the refrigerant in the condenser coil 212, 312 and turning the refrigerant into a liquid state.

As shown in FIG. 2, the condenser 210 of the first cooling unit 200 is positioned approximately centrally in the first cabinet 110 and the condenser 310 of the second cooling unit 200 is positioned approximately centrally in the second cabinet 120. The condenser fan 214, 314 faces away from the container 500 and blows air to an area exterior of the cooling system 10.

As shown in FIGS. 3 and 4, each condenser 210, 310 includes a plurality of condenser coils 212, 312 separately receiving a first refrigerant from the high compressor 220, 320 and a second refrigerant from the low compressor 230, 330. The condenser fan 214, 314 blows air over all of the condenser coils 212, 312 and cools the first refrigerant and the second refrigerant into the liquid state. In an embodiment, the first refrigerant is an R134a refrigerant and the second refrigerant is an R23 refrigerant.

Each high compressor 220, 320, as shown in FIGS. 2 and 3, has a pair of high compressor units 222, 322, a pair of high compressor sensors 224, 324 disposed at the high compressor units 222, 322, a high pressure transducer 226, 326 connected to the high compressor units 222, 322, a low pressure transducer 227, 327 connected to the high compressor units 222, 322, and an ambient temperature sensor 228, 328. Each of the high compressor units 222, 322 receives the first refrigerant from the evaporator 240, 340 in the vapor state and compresses the first refrigerant, raising the temperature and the pressure of the first refrigerant. The first refrigerant is output from the high compressor units 222, 322 in the vapor state. The high pressure transducer 226, 326 controls a high pressure of the first refrigerant in the high compressor units 222, 322 and the low pressure transducer 227, 327 controls a low pressure of the first refrigerant in the high compressor units 222, 322. The high compressor sensors 224, 324 respectively sense a temperature of each of the high compressor units 222, 322. The ambient temperature sensor 228, 328 senses an ambient temperature in the portion of the cabinet 110, 120 containing the high compressor 220, 320.

Each low compressor 230, 330, as shown in FIGS. 2 and 4, has a low compressor unit 232, 332, a low compressor sensor 234, 334 disposed at the low compressor unit 232, 332, a high pressure transducer 236, 336 connected to the low compressor unit 232, 332, a low pressure transducer 237, 337 connected to the low compressor unit 232, 332, and a hot gas solenoid valve 238, 338 connected to the low compressor unit 232, 332. As shown in FIG. 1, a compressor door 231 is attached by a hinge to a side of the first cabinet 110 and is rotatable about the hinge to cover or expose the first low compressor 230 of the first cooling unit 200.

The low compressor unit 232, 332 receives the second refrigerant from the evaporator 240, 340 in the vapor state and compresses the second refrigerant, raising the temperature and the pressure of the second refrigerant. The second refrigerant is output from the low compressor unit 232, 332 in the vapor state. The high pressure transducer 236, 336 controls a high pressure of the second refrigerant in the low compressor unit 232, 332 and the low pressure transducer 237, 337 controls a low pressure of the second refrigerant in the low compressor unit 232, 332. The low compressor sensor 234, 334 senses a temperature of the low compressor unit 232, 332. The hot gas solenoid valve 238, 338 is adapted to controllably divert a hot gas generated by the low compressor unit 232, 332. In an embodiment, the high compressor 220, 320 is adapted to remove heat from the low compressor 230, 330.

Figure 5:
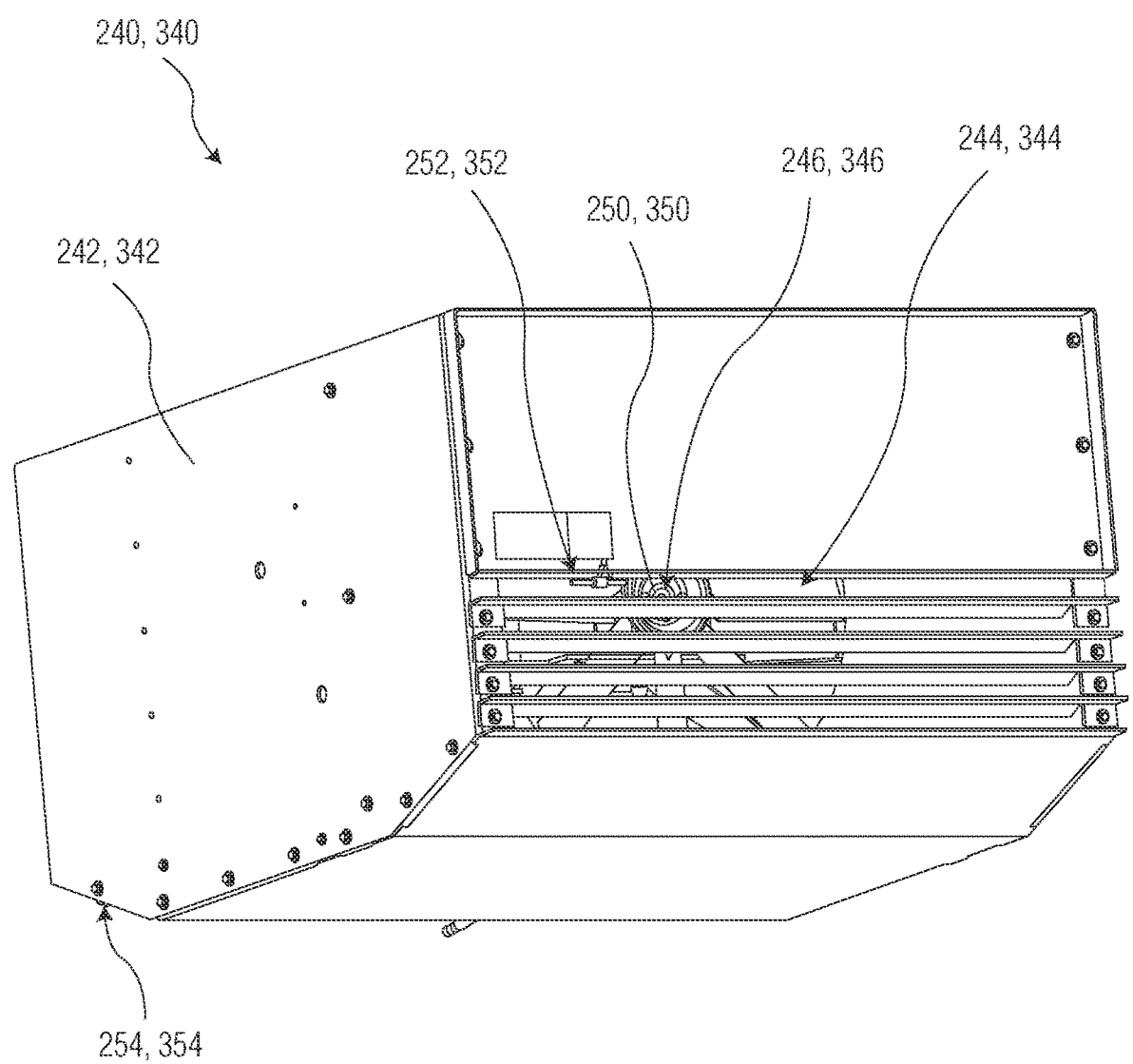
FIG. 5 is a perspective view of an evaporator of the cooling unit.
Figure 6:
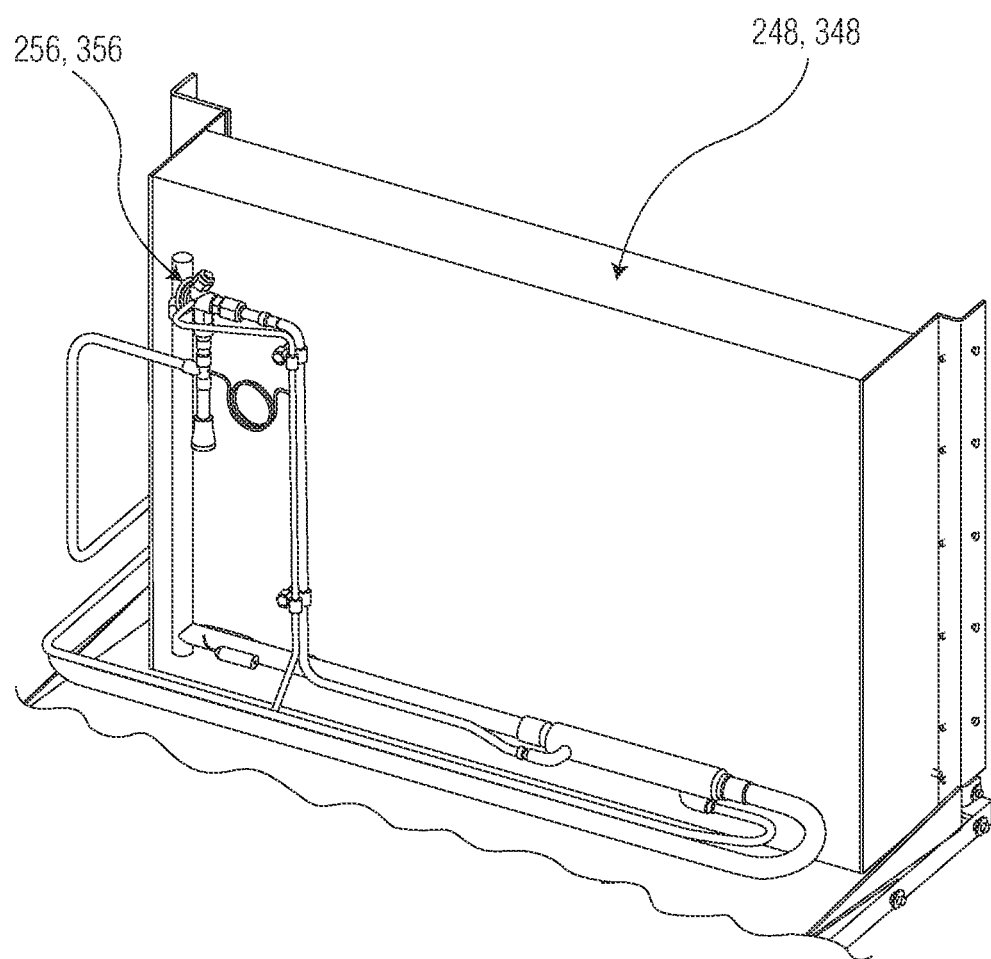
FIG. 6 is a perspective view of an evaporator coil of the evaporator.

Each evaporator 240, 340, as shown in FIGS. 5 and 6, has an evaporator housing 242, 342, an evaporator fan 244, 344 disposed in the evaporator housing 242, 342, an evaporator motor 246, 346 adapted to drive the evaporator fan 244, 344, and an evaporator coil 248, 348. Each evaporator 240, 340 is positioned within the interior of the container 500 shown in FIGS. 1 and 2 and connected to an output of the condenser 210, 310. The evaporator coil 248, 348 shown in FIG. 6 is positioned within the evaporator housing 242, 342 shown in FIG. 5. The evaporator coil 248, 348 receives the first refrigerant and the second refrigerant from the condenser 210, 310 in the liquid state having a low temperature and a low pressure. The first refrigerant and the second refrigerant absorbs heat from the interior of the container 500 and vaporizes in the evaporator coil 248, 348. The evaporator fan 244, 344 blows air over the evaporator coil 248, 348 and aids in the absorption of heat.

Each evaporator 240, 340, as shown in FIGS. 5 and 6, has a plurality of sensors adapted to detect temperatures within and around the evaporator 240, 340. An evaporator motor sensor 250, 350 is disposed at the evaporator motor 246, 346 and adapted to detect a temperature of the evaporator motor 246, 346. A supply air sensor 252, 352 is disposed at an outlet of the evaporator fan 244, 344 and is adapted to detect a temperature of a supply air output from the evaporator 240, 340 into the interior of the container 500. A return air sensor 254, 354 is disposed at an inlet of the evaporator 240, 340 and is adapted to detect a temperature of a return air from the interior of the container 500 into the evaporator 240, 340.

The evaporator coil 248, 348 is connected to an output of the hot gas solenoid valve 238, 338 of the low compressor 230, 330. The hot gas solenoid valve 238, 338 can be controlled to divert the hot gas generated by the low compressor unit 232, 332 to the evaporator coil 248, 348 to heat to the evaporator coil 248, 348, such as to defrost the evaporator coil 248, 348. Each evaporator 240, 340 has a defrost sensor 256, 356, as shown in FIG. 6, disposed at and adapted to detect a temperature of the evaporator coil 248, 348.

Figure 7:
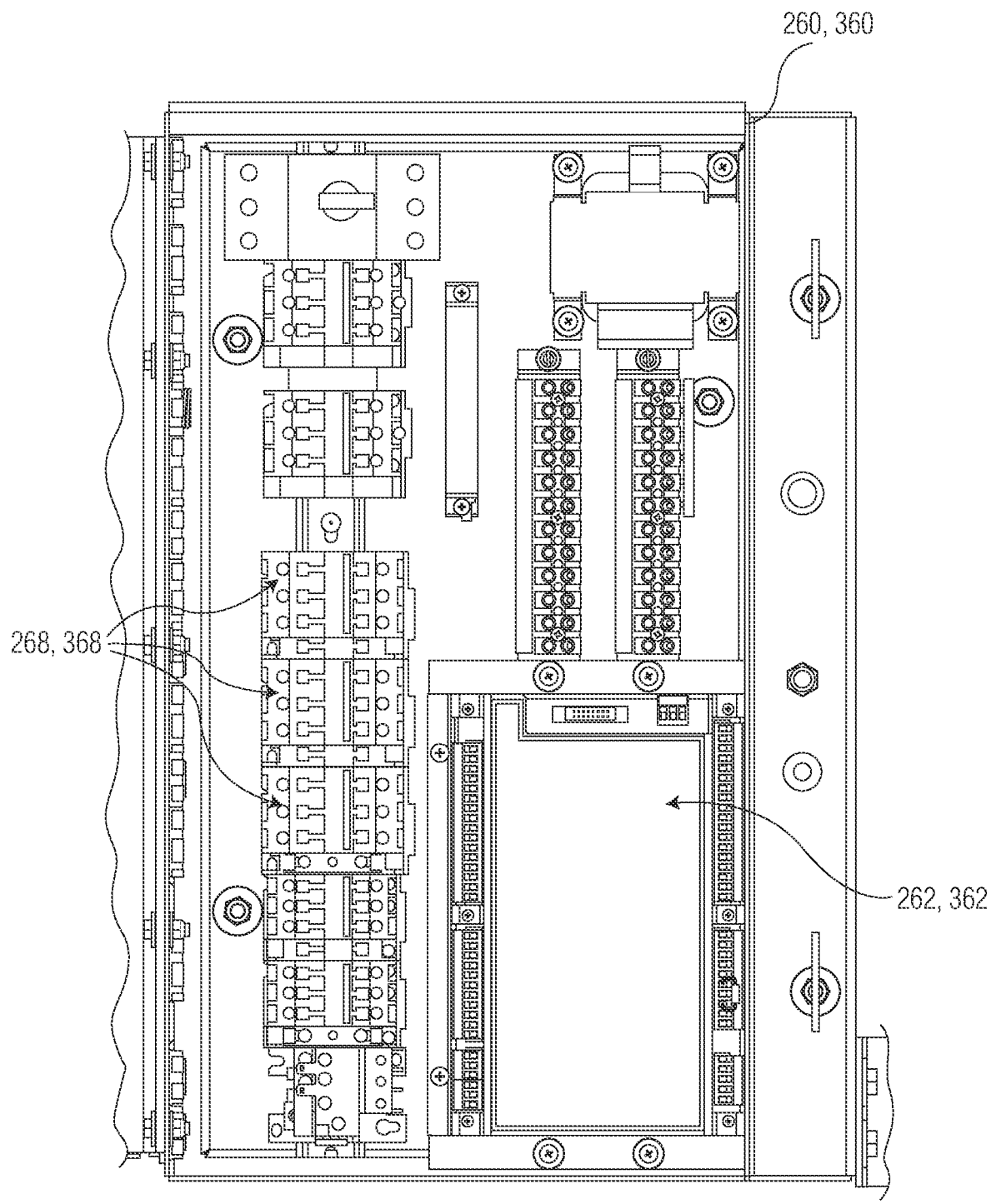
FIG. 7 is a front view of a unit control box of the cooling unit.

Each unit control box 260, 360, as shown in FIGS. 1 and 2, is attached by a hinge to a side of the cabinet 110, 120 and is rotatable about the hinge to cover or expose the respective high compressor 220, 320. Each unit control box 260, 360 has a box door 261, 361 rotatable about a hinge to cover or expose a controller 262, 362 and a plurality of electrical components 268, 368 contained within the unit control box 260, 360, shown in FIG. 7.

The system interface box 400, as shown in FIGS. 1 and 2, is attached by a hinge to a side of the second cabinet 120 and is rotatable about the hinge to cover or expose the low compressor 330 of the second cooling unit 300. The system interface box 400, as shown in FIG. 8, has an interface corresponding to each of the first cooling unit 200 and the second cooling unit 300.

Figure 8:
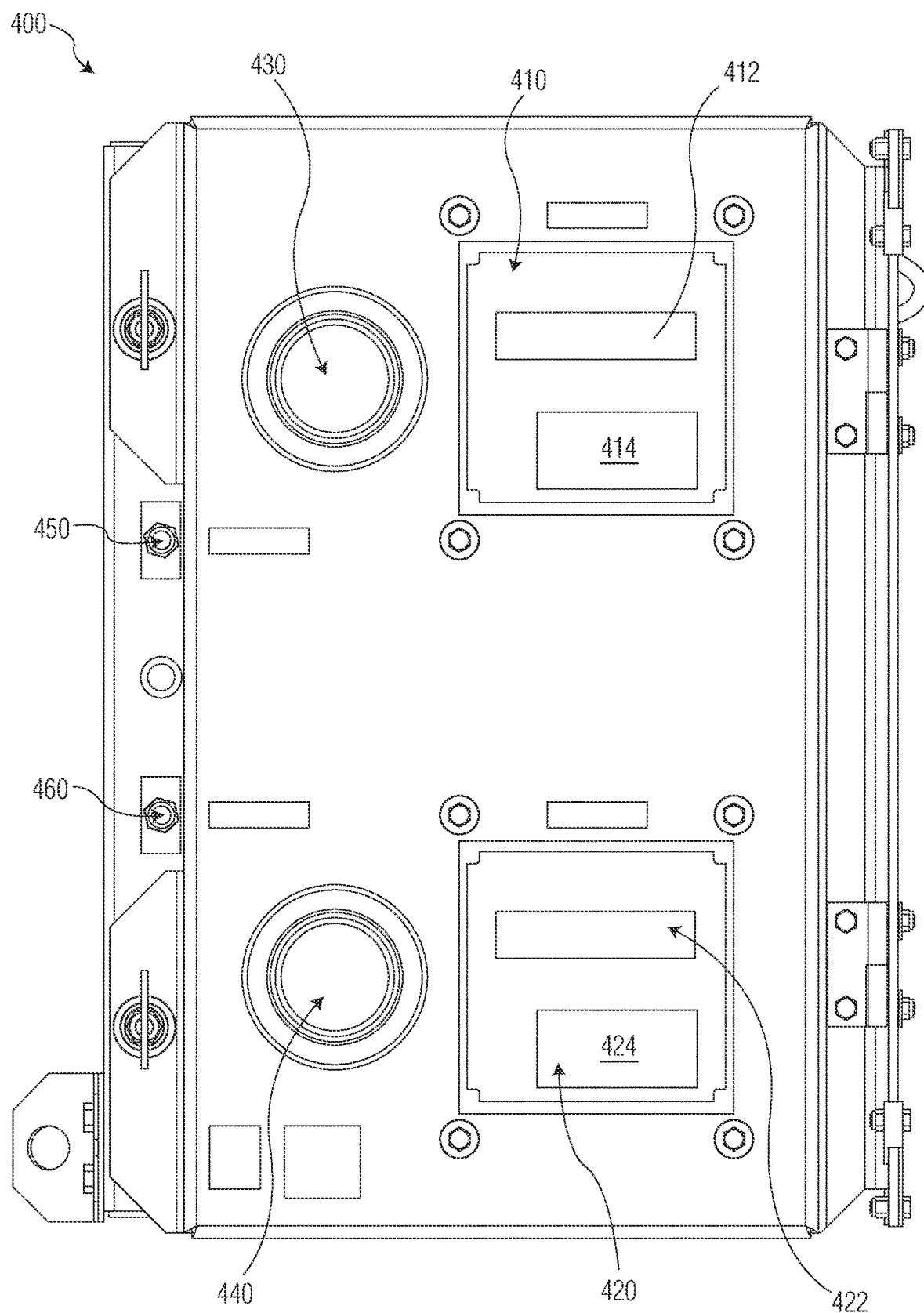
FIG. 8 is a front view of a system interface box of the cooling system.
Figure 9:
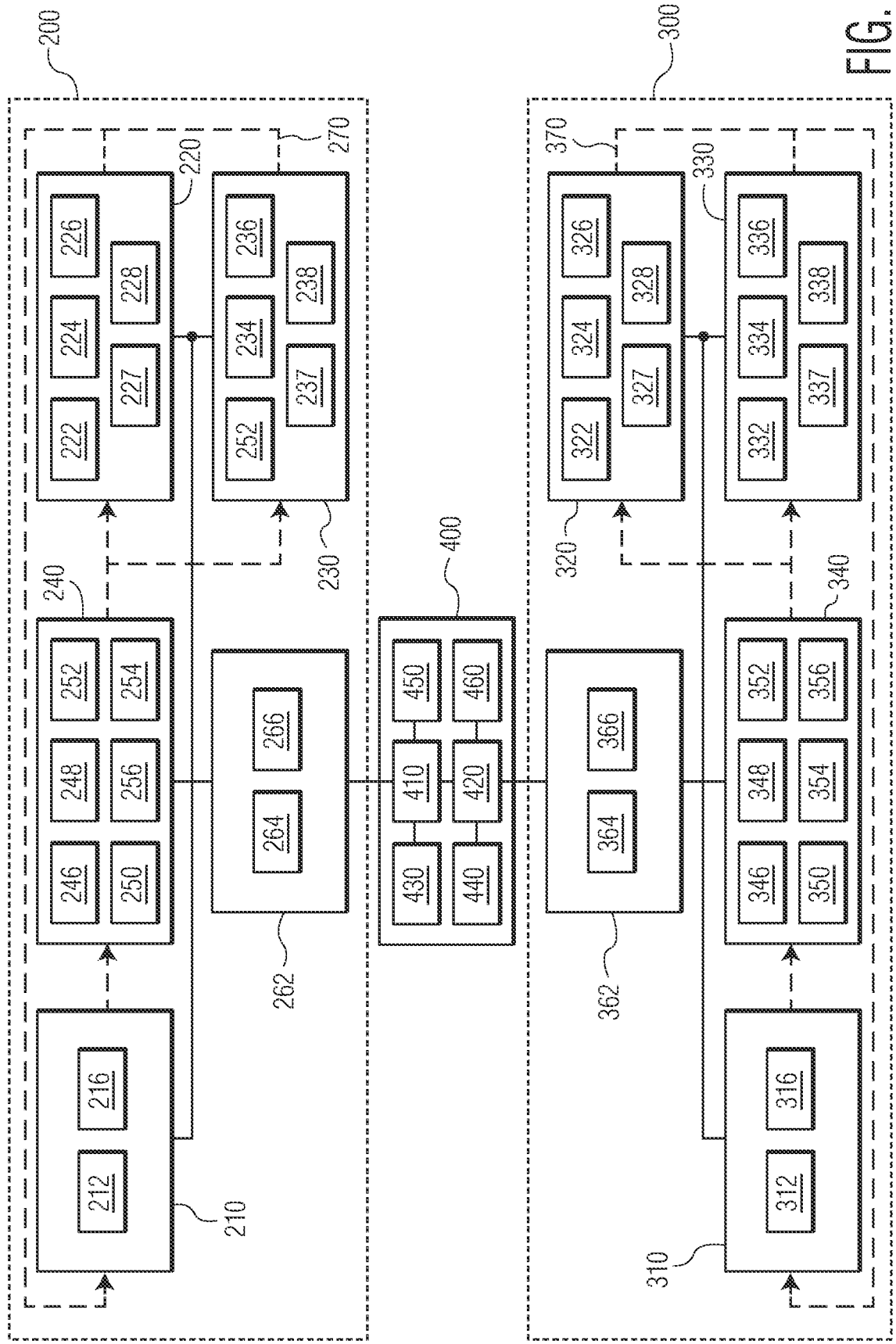
FIG. 9 is a block diagram of the cooling system.

For the first cooling unit 200, as shown in FIGS. 8 and 9, the system interface box 400 has a first user interface 410 connected to the first controller 262 of the first cooling unit 200, a first alarm 430 connected to the first user interface 410, and a first switch 450 adapted to power on or power off the first cooling unit 200. The first user interface 410 has a first display 412 and a first input 414. In the shown embodiment, the first input 414 is a keypad. In other embodiments, the first input 414 may be any other type of computer input.

For the second cooling unit 300, as shown in FIGS. 8 and 9, the system interface box 400 has a second user interface 420 connected to the second controller 362 of the second cooling unit 300, a second alarm 440 connected to the second user interface 420, and a second switch 460 adapted to power on or power off the second cooling unit 300. The second user interface 420 has a second display 422 and a second input 424. In the shown embodiment, the second input 424 is a keypad. In other embodiments, the second input 424 may be any other type of computer input.

The controller 262, 362 of each cooling unit 200, 300, as shown in FIG. 9, has a processor 264, 364 and a memory 266, 366 connected to the processor 264, 364. The memory 266, 366 is a non-transitory computer readable medium capable of storing data and instructions thereon that are executable by the processor 264, 364 to perform the functions of the controller 262, 362 described herein. In various embodiments, the memory 266, 366 may be a read-only memory, a random access memory, a database, or any other type of non-transitory computer readable medium known to those with ordinary skill in the art.

As shown in FIG. 9, the first controller 262 of the first cooling unit 200 communicates with the first user interface 410 by execution of the first processor 264. The second controller 362 of the second cooling unit 300 likewise communicates with the second user interface 420 by execution of the second processor 364. The controllers 262, 362 exchange data and control instructions with the user interfaces 410, 420 as described in greater detail below.

As shown in FIG. 9, the controller 262, 362 of each cooling unit 200, 300 is connected with the condenser 210, 310, the evaporator 240, 340, the high compressor 220, 320, and the low compressor 230, 330 of the respective cooling unit 200, 300 and exchanges data and control instructions with these elements. The controller 262, 362 is connected to and exchanges data and control instructions with the condenser coil 212, 312 and the condenser motor 216, 316 of the condenser 210, 310. The controller 262, 362 is connected to and exchanges data and control instructions with the evaporator motor 246, 346, the evaporator coil 248, 348, the evaporator motor sensor 250, 350, the supply air sensor 252, 352, the return air sensor 254, 354, and the defrost sensor 256, 356 of the evaporator 240, 340. The controller 262, 362 is connected to and exchanges data and control instructions with the high compressor units 222, 322, the high compressor sensors 224, 324, the high pressure transducer 226, 326, the low pressure transducer 227, 327, and the ambient temperature sensor 228, 328 of the high compressor 220, 320. The controller 262, 362 is connected to and exchanges data and control instructions with the low compressor unit 232, 332, the low compressor sensor 234, 334, the high pressure transducer 236, 336, the low pressure transducer 237, 337, and the hot gas solenoid valve 238, 338 of the low compressor 230, 330.

A process 600 of using the dual redundant cooling system 10 to cool the interior of the container 500 will now be described in greater detail primarily with reference to FIG. 10.

In a step 610 of the process 600, the first cooling unit 200 and the second cooling unit 300 are started. To start the cooling units 200, 300, a user switches the first switch 450 and the second switch 460 from an off state to an on state. The first switch 450 activates power to the first cooling unit 200 and the second switch 460 activates power to the second cooling unit 300.

A primary cooling unit of the first cooling unit 200 and the second cooling unit 300 is determined in a next step 620 of the process 600. The user interfaces 410, 420 receive an activation signal from the switches 450, 460 and determine when power is activated to the first cooling unit 200 and the second cooling unit 300. In an embodiment, the primary cooling unit is determined by a relative time of turning on the first cooling unit 200 and the second cooling unit 300. In an embodiment, if the activation signals from the switches 450, 460 indicate that the first cooling unit 200 and the second cooling unit 300 were turned on within 1.5 minutes of each other, the first cooling unit 200 is determined to be the primary cooling unit and the second cooling unit 300 is determined to be a secondary cooling unit. If the first cooling unit 200 was turned on more than 1.5 minutes after the second cooling unit 300, then the second cooling unit 300 is determined to be the primary cooling unit and the first cooling unit 200 is determined to be the secondary cooling unit. In another embodiment, the system interface box 400 may have a primary switch by which the user may select which of the first cooling unit 200 and the second cooling unit 300 is the primary cooling unit.

For the purposes of clarity in the following description with reference to FIG. 10, the first cooling unit 200 will be considered to be the initial primary cooling unit and the second cooling unit 300 will be considered the initial secondary cooling unit determined at step 620. However, as would be understood by those with ordinary skill in the art, the same description with reference to FIG. 10 will similarly apply if the second cooling unit 300 is the initial primary cooling unit and the first cooling unit 200 is the initial secondary cooling unit.

Figure 10:
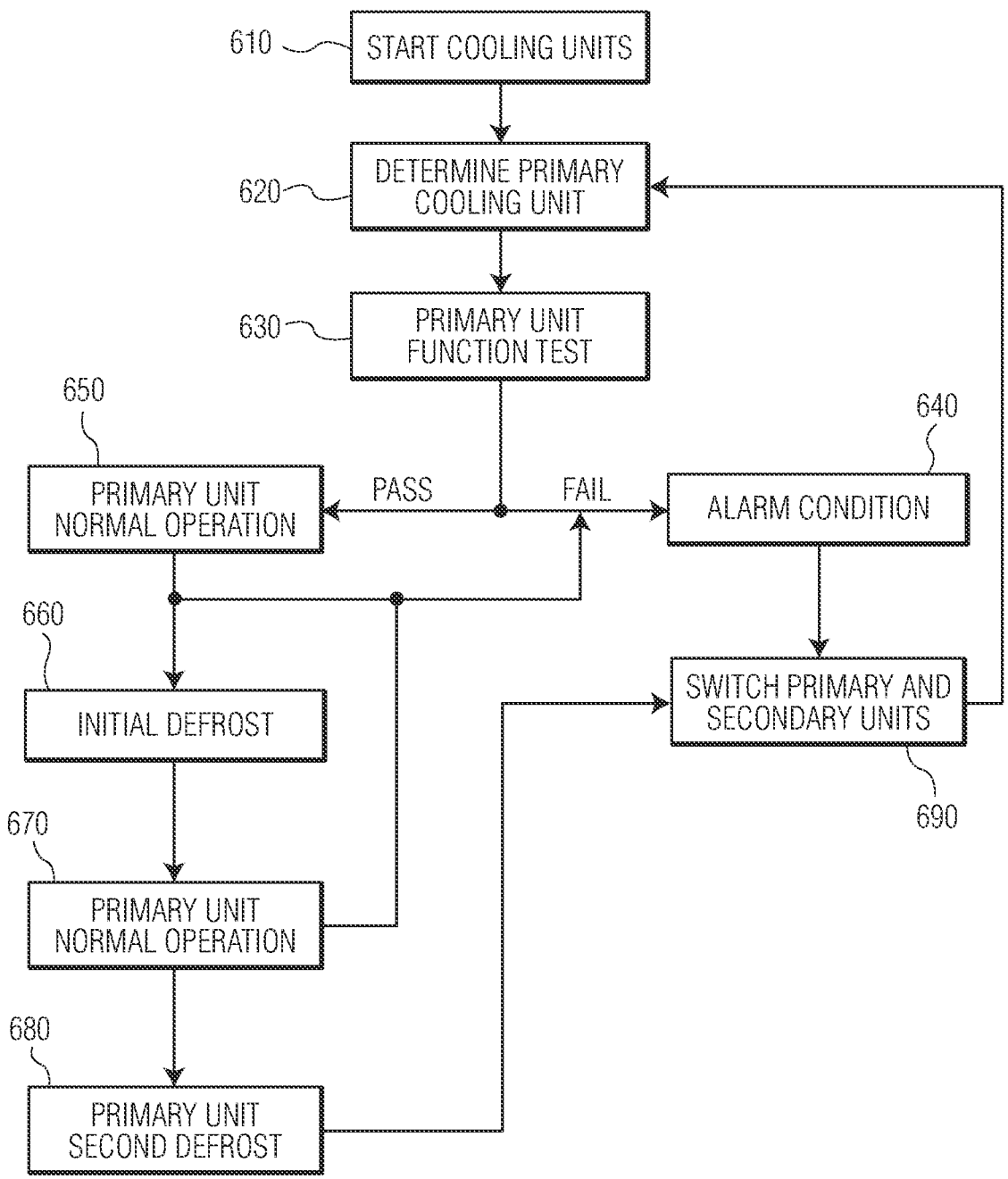
FIG. 10 is a flowchart of a process of cooling an interior of the container using the cooling system.

In a next step 630, as shown in FIG. 10, a function test is performed on the primary cooling unit 200. The function test determines whether an operating ampere data from a number of different elements of the primary cooling unit 200 falls within an appropriate range. The first controller 262 compares the operating ampere data received from each of the elements to an operating ampere data range stored for each element on the first memory 266. If the received operating ampere data for each of the elements falls within the stored operating ampere data range, the first controller 262 determines that the primary cooling unit 200 has passed the function test. If the received operating ampere data for any of the elements falls outside of the corresponding stored operating ampere data range, the first controller 262 determines that the primary cooling unit 200 has failed the function test. The first controller 262 sends a test passed or a test failed message to the first user interface 410 to be output at the first display 412.

In an embodiment, as shown in FIG. 9, the first controller 262 of the primary cooling unit 200 receives an operating ampere data from each of the condenser motor 216, the evaporator motor 246, the high compressor units 222, the low compressor unit 232, and the hot gas solenoid valve 238 in the step 630 and compares each of these to a corresponding stored operating ampere data range. In an embodiment, the stored operating ampere data range can range from 0.5 A to 12 A and can be different for each of the elements.

If the first controller 262 determines that the primary cooling unit 200 has failed the function test, the process proceeds to an alarm condition as shown in step 640 in FIG. 10. In the alarm condition, the first controller 262 of the primary cooling unit 200 sends an alarm signal to the first user interface 410. The alarm signal includes an alarm message and an alarm code stored on the first memory 266 that corresponds to the determined condition. For example, the alarm signal may include an alarm message of "auto test error, amps too low" and an alarm code of a corresponding letter, number, or series of letters and numbers if the received operating ampere data for any of the elements falls below the corresponding stored operating ampere data range. One with ordinary skill in the art would understand that the alarm message and the corresponding alarm code would vary based on the determined condition.

In the alarm condition step 640, first the user interface 410 receives the alarm signal and displays the alarm message and/or the alarm code on the first display 412 for the user. The first user interface 410 also outputs the alarm signal at the first alarm 430. In the shown embodiment, the alarm 430 is a lamp that is lit at the alarm condition. The user can use the input 414 to acknowledge the alarm signal on the display 412. In an embodiment, the alarm 430 remains lit until the determined condition is resolved. A step 660 that follows the alarm condition step 640 will be described in greater detail below.

If the first controller 262 determines that the primary cooling unit 200 has passed the function test, the process proceeds with normal operation of the primary cooling unit 200 to cool the interior of the container 500 in a step 650 shown in FIG. 10. In normal operation, the primary cooling unit 200 cools the interior of the container 500 in a first cooling loop 270 shown in FIG. 9.

The first controller 262 controls the first refrigerant and the second refrigerant to flow through the first cooling loop 270. At the condenser 210, the first controller 262 controls the condenser motor 216 to blow air over the condenser coil 212 to an area exterior of the cooling system 10, turning the refrigerant received from the compressors 220, 230 into a liquid state with a lower temperature and expelling hot air to the exterior the cooling system 10.

The first refrigerant and second refrigerant then enter the evaporator 240, where the first controller 262 controls the evaporator motor 246 to blow air received from the interior of the container 500 over the evaporator coil 248 that contains the liquid refrigerant with the lower temperature. The liquid refrigerant in the evaporator coil 248 absorbs heat from the passing air and the evaporator motor 246 blows colder air back into the interior of the container 500, cooling the interior of the container 500. Liquid refrigerant in the evaporator coil 248, as described above, vaporizes in the evaporator coil 248 as it absorbs heat.

The first controller 262 controls the high compressor units 222, the high pressure transducer 226, the low pressure transducer 227, the low compressor unit 232, the high pressure transducer 236, and the low pressure transducer 237 to compress the vaporized liquid refrigerant received from the evaporator 240. The high compressor 220 and the low compressor 230 are controlled by the first controller 262 to output the first refrigerant and the second refrigerant in the vapor state with a higher temperature and a higher pressure. This output is received at the condenser 210, restarting the first cooling loop 270.

The first controller 262 operates the first cooling loop 270 in the step 650 to cool the interior of the container 500 to a predetermined set point temperature. The set point temperature may be set by the user using the input 414 at the user interface 410. The first controller 262 receives the temperature of the return air from the interior of the container 500 from the return air sensor 254. In normal operation, the first controller 262 operates the first cooling loop 270 if the return air temperature at the return air sensor 254 is 1° C. or more above the set point temperature. In an embodiment, the first controller 262 continues to run the first cooling loop 270 for the longer of a fifteen minute period and when the return air temperature reaches the set point temperature. If the return air temperature at the return air sensor 254 is 2° C. or more below the set point temperature, the first controller 262 stops running the first cooling loop 270 and, in an embodiment, waits a minimum of ten minutes before running the first cooling loop 270 again. In an embodiment, the first cooling loop 270 is capable of maintaining a temperature in the interior of the container 500 and a range of 0 to −65° C.

During the normal operation in step 650, the first controller 262 monitors for additional alarm conditions stored in the first memory 266. The alarm conditions include, for example, a detected temperature of a temperature sensor falling outside of a corresponding temperature range stored in the first memory 266 and a detected pressure of a pressure transducer falling outside of a corresponding pressure range stored in the first memory 266.

In an embodiment, during normal operation in step 650, the first controller 262 receives a detected temperature from the high compressor sensor 224, the ambient temperature sensor 228, the low compressor sensor 234, the evaporator motor sensor 250, the supply sensor 252, the return air sensor 254, and the defrost sensor 256. The first controller 262 compares the detected temperature from each of the sensors to a first corresponding stored range to determine if the sensor is working properly. The first controller 262 also compares the detected temperature from the high compressor sensor 224, the low compressor sensor 234, and the evaporator motor sensor 250 to a second corresponding stored range to determine if the sensed element is overheating. In an embodiment, the first controller 262 also receives a detected pressure from the high pressure transducer 226, the low pressure transducer 227, the high pressure transducer 236, and the low pressure transducer 237. The first controller 262 compares the detected pressure from each of the sensors to a corresponding first stored range to determine if the sensor is working properly and to a corresponding second stored range to determine if the sensed element is working properly. One with ordinary skill in the art would understand that additional and/or other types of sensors could be used in the cooling system 10 to determine other alarm conditions.

If an alarm condition is determined in step 650, the process proceeds to step 640 in FIG. 10. As described above, in the alarm condition step 640, an alarm signal is sent to the first user interface 410, the first user interface 410 displays the alarm message and/or the alarm code on the first display 412 and lights the first alarm 430.

If no alarm condition is determined during normal operation in step 650, the process proceeds to an initial defrost in a step 660 shown in FIG. 10. A defrost operation of the primary cooling unit 200 is required after a period of normal operation to ensure that the first cooling loop 270 is properly cooling the interior of the container 500. In the defrost operation, the first controller 262 controls the hot gas solenoid valve 238 to divert a hot gas generated by the low compressor unit 232 to the evaporator coil 248. The hot gas diverted to the evaporator coil 248 heats the evaporator coil 248, defrosting the evaporator coil 248 by melting any frost accumulated on the evaporator coil 248 that could impair the heat absorption by the evaporator coil 248 and correspondingly impair the cooling of the interior of the container 500. The first controller 262 continues to divert the hot gas to the evaporator coil 248 until a defrost temperature received from the defrost sensor 256 rises by a preset limit. In an embodiment, the preset limit of the defrost temperature is an increase of 5-30° C.

A user sets a defrost timer at the first input 414 of the first user interface 410 and the defrost timer is transmitted to and stored on the memory 266. For the initial defrost in step 660, or the first defrost after the primary cooling unit 200 was turned on, the first controller 262 performs the defrost operation after a predetermined portion of the defrost timer has elapsed during operation of the first cooling loop 270. In an embodiment, the predetermined portion is one quarter of the period set in the defrost timer; the defrost timer is set to 24 hours and normal operation of the first cooling loop 270 is run for 6 hours before the initial defrost. The primary cooling unit 200 and the secondary cooling unit 300 remain the same and are not switched during the initial defrost of the primary cooling unit 200.

After the initial defrost in step 660, the process proceeds to normal operation in step 670. The normal operation of step 670 is the same as the normal operation of step 650; the first cooling loop 270 and the determination of alarm conditions occurs as described under step 650 above.

If no alarm condition is determined during the normal operation of step 670, the process proceeds to a second defrost in a step 680 shown in FIG. 10. The second defrost is initiated by the first controller 262 by at least one of the end of the defrost timer set at the first input 414, a manual initiation of a defrost initiated by the user at the input 414, and a determination of a relative temperature. In an embodiment of the determination of the relative temperature, the first controller 262 compares a supply air temperature sensed by the supply air sensor 252 and a return air temperature sensed by the return air sensor 254; the first controller 262 initiates the second defrost if the supply air temperature is more than 10° C. lower than the return air temperature. In another embodiment of the determination of relative temperature, the first controller 262 compares the return air temperature and the defrost temperature sensed by the defrost sensor 256; the first controller 262 initiates the second defrost if the defrost temperature is more than 15° C. lower than the return air temperature. The defrost operation of the second defrost in step 680 is the same as the defrost operation in the initial defrost of step 660 described above.

As shown in FIG. 10, after the alarm condition in step 640 or after the initiation of the second defrost in step 680, the process proceeds to a step 690. In the step 690, the primary cooling unit, described by way of example with reference to the first cooling unit 200 above, is switched to the secondary cooling unit and the secondary cooling unit, described by way of example with reference to the second cooling unit 300 above, is switched to the primary cooling unit. In the step 690, the first controller 262 of the previously primary first cooling unit 200 sends a switch signal to the second controller 362 of the previously secondary second cooling unit 300 either at the determination of the alarm condition or at the initiation of the second defrost. The first cooling unit 200 then enters a standby state from the normal operation state. The second cooling unit 300 switches from the standby state to the normal operation state and, looping back to step 620, the second cooling unit 300 becomes the primary cooling unit 300 and the first cooling unit 200 becomes the secondary cooling unit 200.

The process shown in FIG. 10 then executes the same steps 630-690 described above with the second cooling unit 300 as the primary cooling unit 300. The function test is performed on the primary cooling unit 300 in step 630; the alarm condition is determined in step 640 if the primary cooling unit 300 fails the function test, and the primary cooling unit 300 enters normal operation in step 650 if the primary cooling unit 300 passes the function test. The same operations apply to the second cooling unit 300 as the primary cooling unit as described with respect to the first cooling unit 200 as the primary cooling unit above, with the similar reference numbers and elements of the second cooling unit 300 performing the same functions as the counterparts in the first cooling unit 200. The second cooling unit 300 runs a second cooling loop 370 shown in FIG. 9 during normal operation to cool the interior of the container 500. The second cooling unit 300 as the primary cooling unit 300 engages in normal operation in step 650, undergoes an initial defrost in step 660, and again executes normal operation in step 670. In the standby state, the first cooling unit 200 serving as the secondary cooling unit 200 does not run the first cooling loop 270. Either the first cooling loop 270 or the second cooling loop 370 is operating at a given time.

When the second cooling unit 300 as the primary cooling unit 300 reaches the alarm condition in step 640 or the second defrost in step 680, the process again switches the primary and secondary cooling units provided any alarm in the secondary cooling unit 200 has been resolved.

The process shown in FIG. 10 continues to loop, switching the primary cooling unit that is responsible for cooling the interior of the container 500 between the first cooling unit 200 and the second cooling unit 300 based on the presence of an alarm condition or a non-initial defrost. The dual redundant cooling system 10 thereby avoids using a malfunctioning cooling unit 200, 300 to cool the interior of the container 500. The dual redundant cooling system 10 thereby also avoids the heat generated during the non-initial defrost operations from raising the temperature in the interior of the container 500 by using the other cooling unit the cool the interior of the container 500 while the first cooling unit is defrosting. The dual redundant cooling system 10 thus avoids even small temperature variations during storing or shipping while maintaining the interior of the container 500 at the predetermined set point temperature.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalent.

What is claimed is:

1. A dual redundant cooling system for a container, comprising:
 a first cooling unit positioned in a first cabinet attached to the container, the first cooling unit having a first controller operating a first cooling loop to cool an interior of the container; and
 a second cooling unit positioned in a second cabinet attached to the container and adjacent the first cabinet, the second cooling unit having a second controller operating a second cooling loop to cool the interior of the container, the first controller and the second controller communicate a switch signal between each other so that either the first cooling unit is a primary cooling unit operating the first cooling loop or the second cooling unit is the primary cooling unit operating the second cooling loop;
a system interface box positioned in the second cabinet and connected to the first cooling unit and the second cooling unit;
wherein the primary cooling unit and a secondary cooling unit are determined by a relative time of an activation signal from a first switch and an activation signal from a second switch.

2. The dual redundant cooling system of claim 1, wherein the first cooling unit and the first cooling loop are separate from the second cooling unit and the second cooling loop.

3. The dual redundant cooling system of claim 2, wherein the system interface box includes the first switch adapted to power on or power off the first cooling unit and the second switch adapted to power on or power off the second cooling unit.

4. The dual redundant cooling system of claim 1, wherein the first cooling unit and the second cooling unit each have identical components that function identically.

5. The dual redundant cooling system of claim 1, wherein the first cooling unit or the second cooling unit that is not the primary cooling unit is the secondary cooling unit, the secondary cooling unit is in a standby state in which the cooling loop of the secondary cooling unit is not operated.

6. The dual redundant cooling system of claim 1, wherein the primary cooling unit operates the first cooling loop or the second cooling loop before an initial defrost operation and between the initial defrost operation and a second defrost operation.

7. The dual redundant cooling system of claim 6, wherein the switch signal is transmitted when the primary cooling unit enters the second defrost operation.

8. The dual redundant cooling system of claim 7, wherein the first cooling loop of the first cooling unit and the second cooling loop of the second cooling unit each have a condenser, an evaporator connected to the condenser, and a high compressor and a low compressor connected between the evaporator and the condenser.

9. The dual redundant cooling system of claim 8, wherein, in the initial defrost operation and the second defrost operation, the first controller or the second controller of the primary cooling unit controls a hot gas solenoid valve of the low compressor to divert a hot gas from the low compressor to an evaporator coil of the evaporator.

10. The dual redundant cooling system of claim 9, wherein the initial defrost operation is initiated after a predetermined portion of a defrost timer has elapsed during operation of the first cooling loop or the second cooling loop.

11. The dual redundant cooling system of claim 10, wherein the second defrost operation is initiated after an entirety of the defrost timer has elapsed or upon a manual initiation.

12. The dual redundant cooling system of claim 9, wherein the first cooling loop of the first cooling unit and the second cooling loop of the second cooling unit each have a supply air sensor adapted to detect a temperature of a supply air output from the evaporator, a return air sensor adapted to detect a temperature of a return air from the interior of the container into the evaporator, and a defrost sensor adapted to detect a temperature of the evaporator coil.

13. The dual redundant cooling system of claim 10, wherein the second defrost operation is initiated if the temperature of the supply air is more than 10° C. lower than the temperature of the return air, or if the temperature of the evaporator coil is more than 15° C. lower than the temperature of the return air.

14. A dual redundant cooling system for a container, comprising:
a first cooling unit positioned in a first cabinet attached to the container, the first cooling unit having a first controller operating a first cooling loop to cool an interior of the container;
a second cooling unit positioned in a second cabinet attached to the container and adjacent the first cabinet, the second cooling unit having a second controller operating a second cooling loop to cool the interior of the container, the first controller and the second controller communicate a switch signal between each other so that either the first cooling unit is a primary cooling unit operating the first cooling loop or the second cooling unit is the primary cooling unit operating the second cooling loop, wherein the first controller or the second controller of the primary cooling unit controls the first cooling loop or the second cooling loop to cool the interior of the container to a predetermined set point temperature, the first cooling loop of the first cooling unit and the second cooling loop of the second cooling unit each have a return air sensor adapted to detect a temperature of a return air from the interior of the container into an evaporator, the first cooling loop or the second cooling loop of the primary cooling unit is operated if the temperature of the return air is 1° C. or more above the predetermined set point temperature, the first controller or the second controller of the primary cooling unit operates the first cooling loop or the second cooling loop for a longer of a preset time period and when the temperature of the return air reaches the predetermined set point temperature; and
a system interface box connected to the first cooling unit and the second cooling unit, the system interface box having a first user interface connected to the first controller of the first cooling unit and a second user interface connected to the second controller of the second cooling unit.

15. The dual redundant cooling system of claim 14, wherein a high compressor compresses a first refrigerant and a low compressor compresses a second refrigerant.

16. The dual redundant cooling system of claim 15, wherein the first controller or the second controller of the primary cooling unit stops operating the first cooling loop or the second cooling loop if the temperature of the return air is 2° C. or more below the predetermined set point temperature.

* * * * *